United States Patent [19]
Ariizumi et al.

[11] Patent Number: 4,673,969
[45] Date of Patent: Jun. 16, 1987

[54] SEMICONDUCTOR DEVICE HAVING MULTIPLE CONDUCTIVE LAYERS AND THE METHOD OF MANUFACTURING THE SEMICONDUCTOR DEVICE

[75] Inventors: Shoji Ariizumi; Makoto Segawa, both of Tokyo, Japan

[73] Assignee: Kabushiki Kaisha Toshiba, Kawasaki, Japan

[21] Appl. No.: 814,295

[22] Filed: Dec. 30, 1985

Related U.S. Application Data

[63] Continuation of Ser. No. 639,619, Aug. 10, 1984, which is a continuation of Ser. No. 302,122, Sep. 14, 1981.

[30] Foreign Application Priority Data

Sep. 22, 1980 [JP] Japan ................................ 55-132146
Sep. 22, 1980 [JP] Japan ................................ 55-132147

[51] Int. Cl.$^4$ ........................................... H01L 23/48
[52] U.S. Cl. .................... 357/71; 357/23.9; 357/41; 357/51; 357/59
[58] Field of Search ................ 357/59, 71, 41, 51, 357/23.9

[56] References Cited

U.S. PATENT DOCUMENTS

| | | | |
|---|---|---|---|
| 4,163,246 | 7/1979 | Aomura et al. | 357/71 S |
| 4,222,062 | 9/1980 | Trotter et al. | 357/59 |
| 4,240,097 | 12/1980 | Raymond, Jr. | 357/71 S |
| 4,278,989 | 7/1981 | Baba et al. | 357/59 |
| 4,329,706 | 5/1982 | Crowder et al. | 357/59 |

FOREIGN PATENT DOCUMENTS

| | | | |
|---|---|---|---|
| 54-107280 | 8/1979 | Japan | 357/59 R |
| 54-101282 | 8/1979 | Japan | 357/59 R |

Primary Examiner—William D. Larkins
Attorney, Agent, or Firm—Oblon, Fisher, Spivak, McClelland & Maier

[57] ABSTRACT

A semiconductor device having a pair of wiring layers connected in parallel with each other in which a first wiring layer is formed over a semiconductor substrate through a insulation layer. The first wiring layer is made of poly-Si and has relatively high resistivity. Therefore a second wiring layer is formed over the first wiring layer through an insulation layer. A portion of the second wiring layer has low conductivity and is parallel connected to the first wiring layer in order to reduce the resistivity of the wiring layer. Another portion of the second wiring layer has low conductivity and is used as resistive means.

5 Claims, 16 Drawing Figures

SEMICONDUCTOR DEVICE HAVING MULTIPLE CONDUCTIVE LAYERS AND THE METHOD OF MANUFACTURING THE SEMICONDUCTOR DEVICE

This application is a continuation of abandoned application Ser. No. 639,619 filed Aug. 10, 1984, which is a continuation of abandoned parent application Ser. No. 302,122, filed Sept. 14, 1981.

BACKGROUND OF THE INVENTION

1. Field of the Invention

This invention relates to a semiconductor device having a connecting structure for connecting in parallel two conductive layers to decrease the resistance of wiring layers.

2. Description of the Prior Art

In prior semiconductor integrated circuit devices, metal layers, diffusion regions formed in a semiconductor substrate, polycrystalline silicon (poly-Si) layers, and so on have been used as a wiring means. But, poly-Si layers are often used in a semiconductor device having multiple conductive layers.

Especially, in a static RAM (Random Access Memory) with four transistors and two resistors per one bit cell, a first poly-Si layer is used as the gate electrodes of MOS transistors and as wiring between circuit elements, and a second poly-Si layer is used as resistors. The static RAM circuit is shown in FIG. 1. MOS transistors (1) and (2) operate as gate transferring signals and MOS transistors (3) and (4) construct a flip-flop circuit. The sources of transistors 3 and 4 are connected to ground terminal Vss. Resistors (5) and (6) are loads and are connected to power source Vcc. The gates of the transistors (1) and (2) are connected to the word line 7 and the sources thereof are respectively connected to data lines 8 and 9. The signals of the data lines 8 and 9 are inverse to each other.

In the prior structure of this device, the data lines 8 and 9 are made of aluminum and the word line 7 is made of poly-Si.

So the delay time of the address-decode signal increases and is often over the tolerance limit in a high-speed static RAM. The delay time of the address-decode signal is substantially determined by the RC product of the gate capacitance C of the transfer gates (1) and (2) and the resistive value R of the word line (7). As the gate capacitance is determined by the characteristic peculiar to the transistor, it is difficult to decrease the gate capacitance C. So, it is necessary to decrease the resistive value R of the word line 7 in order to decrease the delay time of the address-decode signal. A structure improving the fault is disclosed in commonly owned U.S. application Ser. No. 128,955 filed Mar. 10, 1980. But the second poly-Si layer in the application has a low resistance value, so that it cannot be used as a load resistor. So a third poly-Si layer must be formed thereover as a load resistor. In general, as a conductive layer is formed on an insulation layer laying over another conductive layer, the thickness of the layer between the first and third conductive layers increases unnecessarily and the contact holes to the first conductive layer will be formed later. Further, a difference of the layer level become larger, too, so the metal layer thereon is easily cut off at the stepped portion. So, this structure is not desirable in a densely constructed integrated circuit device.

SUMMARY OF THE INVENTION

It is accordingly an object of the present invention to provide an improved semiconductor device which is constructed in high density and operates at high speed, and an improved method of manufacturing the device.

It is another object of this invention to provide an improved semiconductor device having two wiring layers connected in parallel to decrease the resistance, and an improved method of manufacturing the device.

It is another object of this invention to provide an improved semiconductor device having a first conductive layer operating as a gate electrode and a wiring layer, a second conductive layer connected with the first conductive layer in parallel and a poly-Si resistor formed in the same layer level as second conductive layer, and an improved method of manufacturing the device.

It is another object of this invention to provide an improved semiconductor device comprising a plurality of semiconductor elements having at least one PN junction and formed on a substrate, a first insulation layer formed on the substrate, a first conductive layer formed on the first insulation layer, a second conductive layer formed on the first conductive layer, and a second conductive layer formed on the second insulation layer, wherein the second conductive layer includes one region having high conductivity and an other region having low conductivity, and the high conductivity region is parallel connected to the first conductive layer through a plurality of contact holes, and the low conductivity region is used as a resistive means.

BRIEF DESCRIPTION OF THE DRAWING

These and other objects and many of the attendant advantages of this invention will be readily appreciated as the same becomes bettter understood by reference to the following detailed description when considered in connection with the accompanying drawings, in which like reference numerals designate the same or corresponding parts throughout the several views, wherein.

DESCRIPTION OF THE PREFERRED EMBODIMENTS

Figure 2:
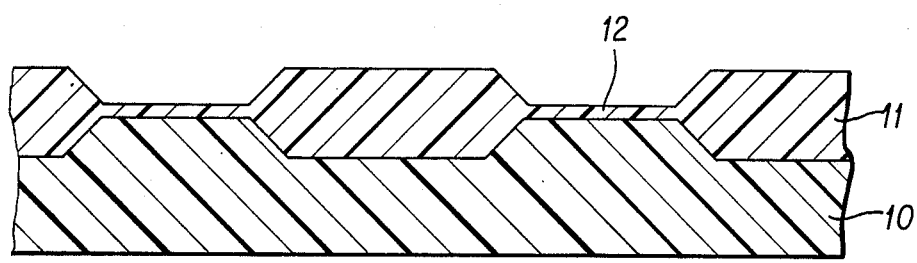
FIGS. 2 to 6 are cross-sectional views illustrating successive steps of fabricating the semiconductor device of this invention.
Figure 3:
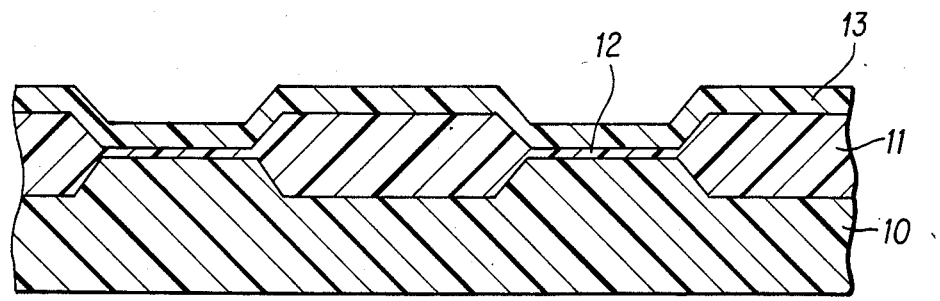
Figure 4:
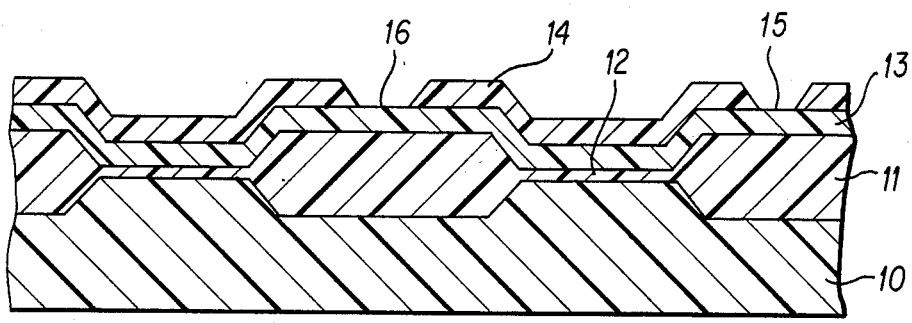
Figure 5:
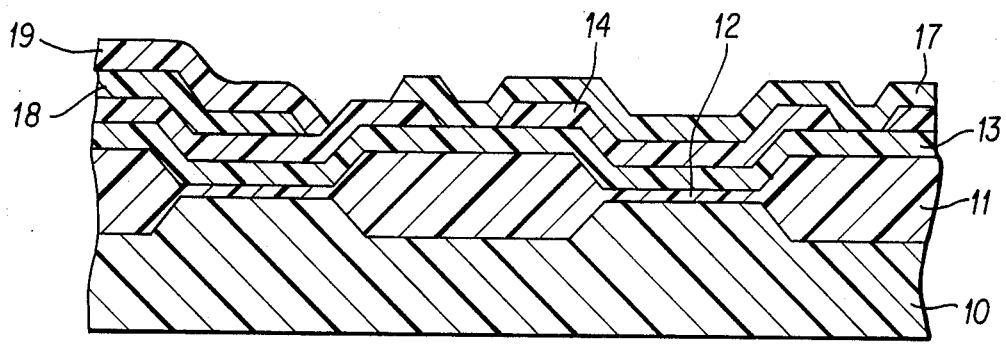
Figure 6:
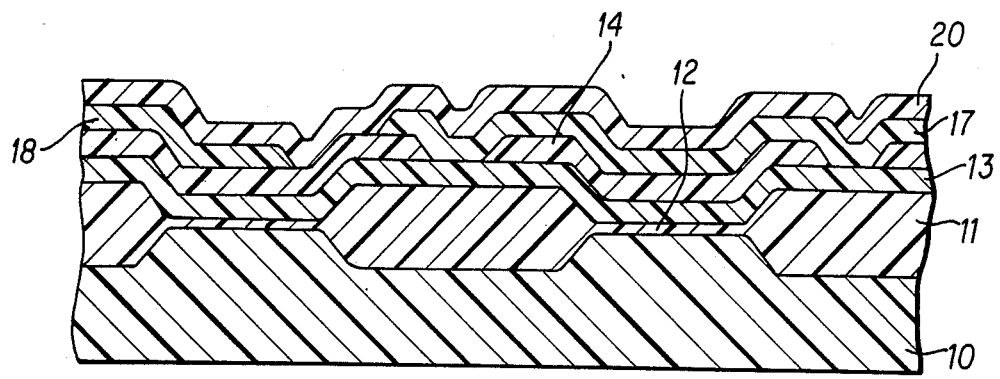

Referring now to the drawing, wherein like reference numerals designate identical or corresponding parts throughout the several views, and more particularly to FIG. 2, a field silicon oxide ($SiO_2$) layer (11) is formed by a selective oxidation of a P type silicon substrate (10). It is desirable that the resistivity of the substrate (10) is about 20 to 50 Ω.cm. The insulation layer (11) has a thickness of about 1 μm. Next a gate oxide layer (12) is formed by a thermal oxidation on the substrate (10). The gate oxide layer (12) has a thickness of about 400 to 1000 Å. After this step, the gate oxide layer (12) may be selectively etched. A poly-Si layer (13) is then deposited on the insulation layer (11) and layer (12) by using a chemical vapor deposition process as shown in FIG. 3. Phosphorus ion impurities may be diffused into the poly-Si layer (13) in order to reduce the resistivity of the poly-Si layer (13). The poly-Si layer (13) is selectively etched and may operate as a gate electrode and a wiring layer between circuit elements. Arsenic ion impurities are diffused into the substrate (10) by using the field insulation layer (11) and the poly-Si layer (13) as a mask. N+ regions are formed by this process in the substrate (10) and operate as source and drain regions of MOS transistors or other circuit elements not shown in the Figures. Phosphorus ions may be diffused instead of arsenic ions. Next an insulation layer (14) is formed at least on the poly-Si layer (13) as shown in FIG. 4. The insulation layer (14) has a thickness of about 2000 to 4000 Å and is made of SiO$_2$ formed by a thermal oxidation technique or a chemical vapor deposition tecnique. Contact holes (15) and (16) are formed on the field insulation layer (11) by etching the insulation layer (14) selectively, as shown in FIG. 4. The multi-wiring layers will be connected to each other through the contact holes (15) and (16). Next a poly-Si layer is deposited over the substrate (10). Then, the poly-Si layer is selectively etched by using a photoresist mask having a predetermined pattern, as shown in FIG. 5. The poly-Si layers (17) and (18) are respectively used as an additional wiring layer and a resistive element. Then, a photoresist layer (19) covers the poly-Si layer (18) to be used as a resistive means. The photoresist layer (19) can be replaced by a SiO$_2$ layer. An impurity, for example a phosphorus ion, is diffused into the poly-Si layer (17) in order to reduce the resistivity. In this process, the impurity is not diffused into the poly-Si layer (18) due to the existence of the photoresist layer (19). So the poly-Si layer (17) has low resistivity and is used as an additional wiring layer, but the poly-Si layer (18) has high resistivity. The poly-Si layer (17) is parallel connected to the first poly-Si layer (13) through the contact holes (15) and (16). Nextly, the photoresist layer (19) is removed and an insulation layer (20) covers the poly-Si layers (17) and (18) as shown in FIG. 6. The insulation layer (20) has a thickness of about 1 μm and is made of SiO$_2$. Then contact holes are formed by a photo engraving process and an external electrode of aluminum is formed on the insulation layer (20) including the contact holes. In this structure, the first poly-Si layer (13) and the additional wiring layer (17) are connected on the field insulation layer in parallel. So, the resistivity of the wiring layer is reduced to half that of the prior art device. Also some regions of, the poly-Si layer formed in the same step are used as a resistor and an additional wiring layer, so that the thickness of insulation layer thereunder is maintained at the same thickness and the difference of total layer is diminished. Further, it can be realized in a simple process.

Figure 1:
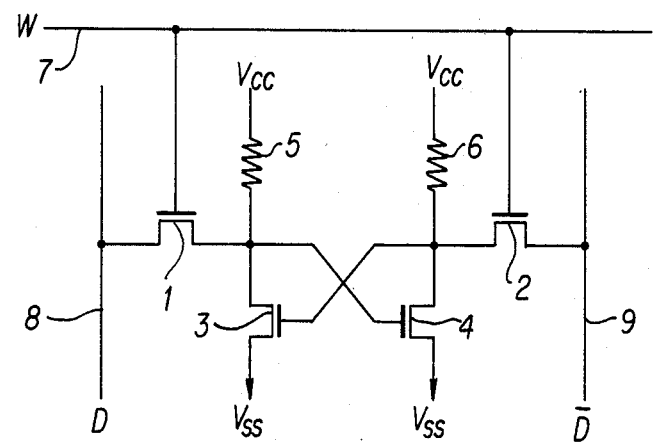
FIG. 1 is a circuit diagram of a circuit to which this invention can be applied.
Figure 7:
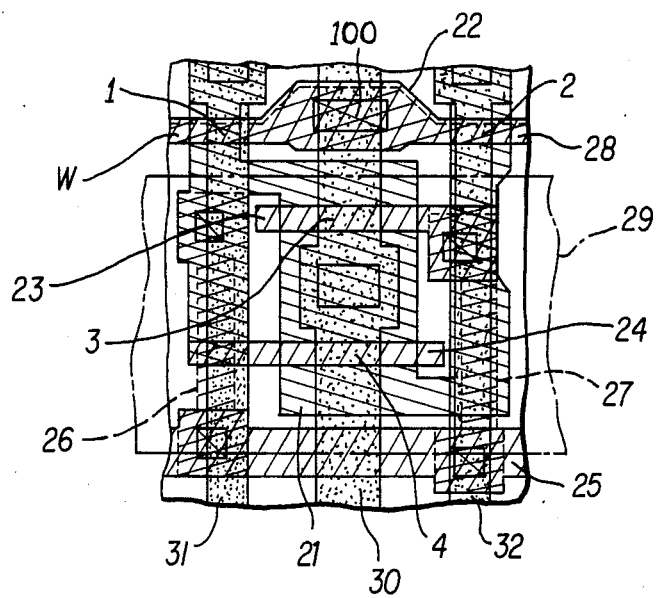
FIG. 7 is a plane pattern view of the semiconductor device of this invention.

FIG. 7 shows the plane pattern of the memory cell in FIG. 1 formed by the process of this invention. In FIG. 7, the region (21) is the N+ region operating as the source and drain regions of the transistors (1), (2), (3) and (4). Regions (22), (23), (24) and (25) are the first poly-Si layer, and respectively operate as the gate electrode of the transistors (1) and (2) and the word line (7), the gate electrode of the transistor (3), the gate electrode of the transistor (4) and the conductive layer to the Vcc. The layers (23) and (24) are respectively connected to the drain regions of the transistors (3) and (4) through the contact holes. The regions (26) and (27) are the second poly-Si layer having high resistivity, and are respectively the resistors (5) and (6). Both ends thereof are connected to the gate electrodes of respective transistors (3) and (4) and the Vcc line (25). The region (28) surrounded by a dotted line is the second poly-Si layer having low resistivity and is the additional wiring layer connected in parallel to the word line (22) through the contact holes. The resistivity of the poly-Si layer is reduced by implanting ions. In this step, the mask layer (29) made of SiO$_2$ will be covered on the resistor layers (26) and (27). Then the regions (30), (31) and (32) are the aluminum layer, and are respectively the ground line and the data lines (8) and (9).

Figure 8:
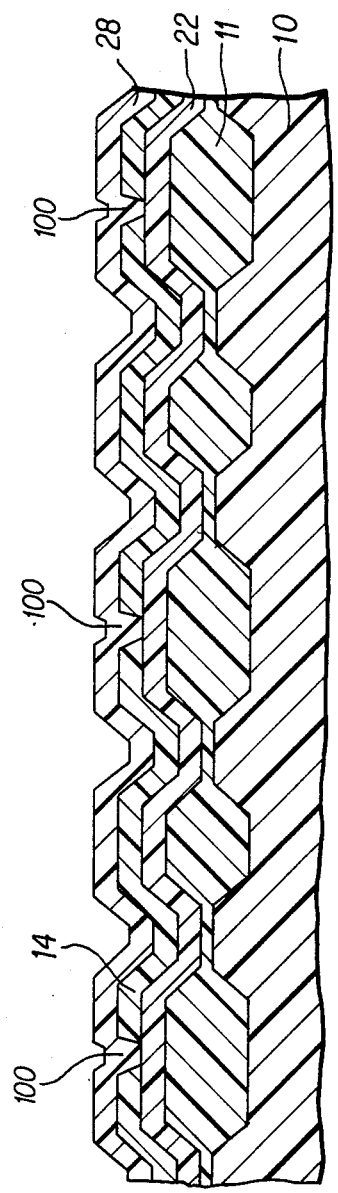
FIG. 8 is a cross-sectional view of the semiconductor device of this invention.
Figure 9:
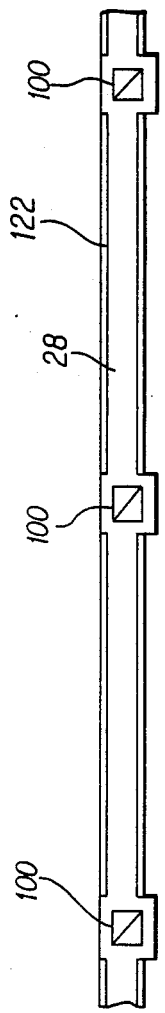
FIG. 9 is a plane pattern view of the device of FIG. 8.

In the memory device of the above-mentioned structure, the first poly-Si layer having low resistivity is used as the active elements like the electrodes of the transistors, the data line and the other wiring layer. The second poly-Si layer includes the low resistivity region and the high resistivity region. The high resistivity region is used as the resistor, and the low resistivity region is used as the additional wiring layer connected to the first poly-Si layer in parallel. In the device of FIG. 7, as the resistors (26) and (27) made of poly-Si can be formed over the flip-flop circuit constructed by the transistors (3) and (4), the additional wiring layer (28) can be arranged over the transistors (1) and (4) in parallel with the word line (22). FIG. 8 shows the structure in which the first and second poly-Si layers (22) and (28) are connected in parallel through many contact holes (100) on the field insulation layer. FIG. 9 is the plane pattern of the structure in FIG. 8. As shown in FIG. 9, the second poly-Si layer (28) is formed narrower than the first poly-Si layer (22). This minimizes the difference in levels of the double poly-Si layers. Further, as the first poly-Si layer (22) is parallel connected to the low resistivity layer (28) of the second poly-Si layer through a plurality of the contact holes (100), the resistivity of the word line (7) is substantially half that of the prior art device. So the delay time of the word line (7) is decreased, and the high speed memory device can be realized. Since the second poly-Si layer formed in the same step is used as the wiring layer of low resistivity layer and the resistor of the high resistivity layer, the process can be simplified. The invention is applicable to a circuit including a low resistivity layer and an inverter of a load resistor and a driving MOS transistor, too. Further, it is desirable to form large contact holes because the resistivity of the wiring layer is decreased at low level.

Figure 10:
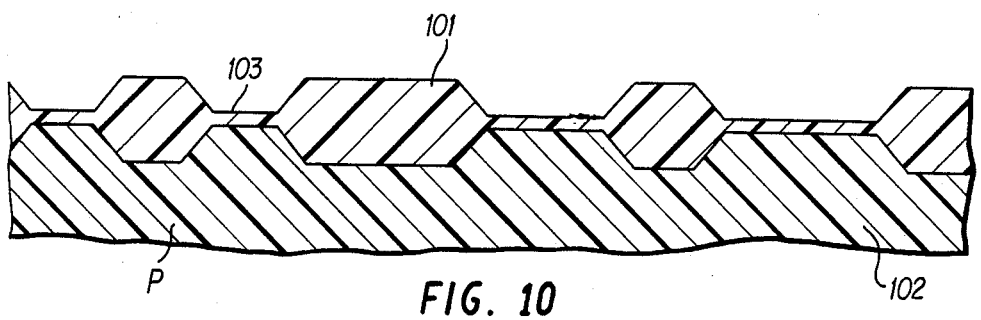
FIGS. 10 to 13 are cross-sectional views illustrating successive steps of fabricating the semiconductor device of this invention.
Figure 11:
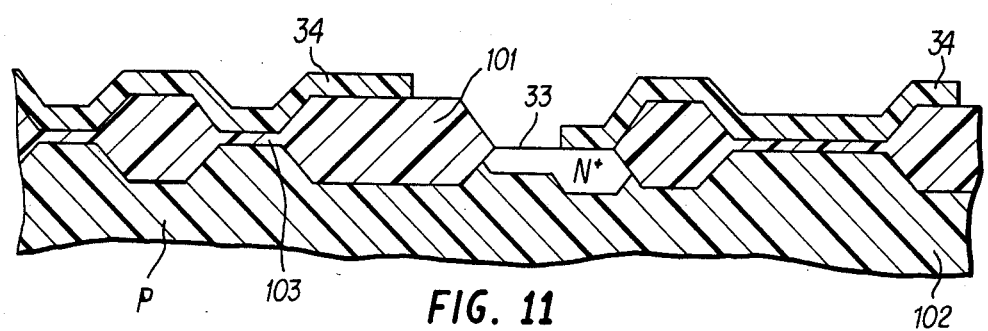
Figure 12:
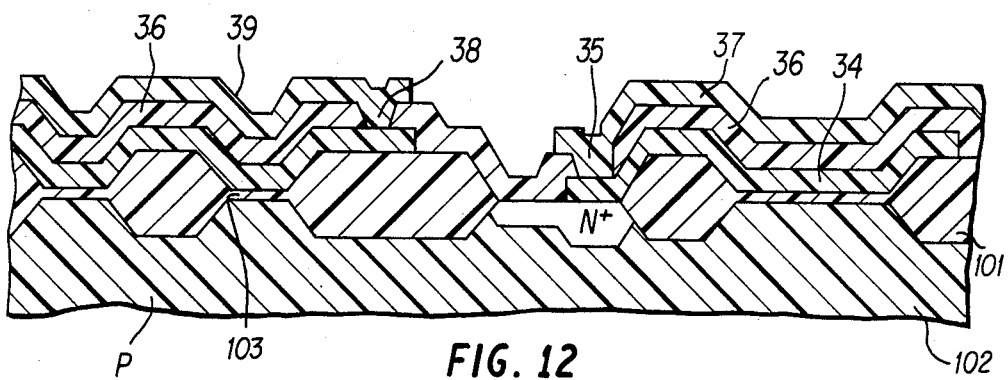
Figure 13:
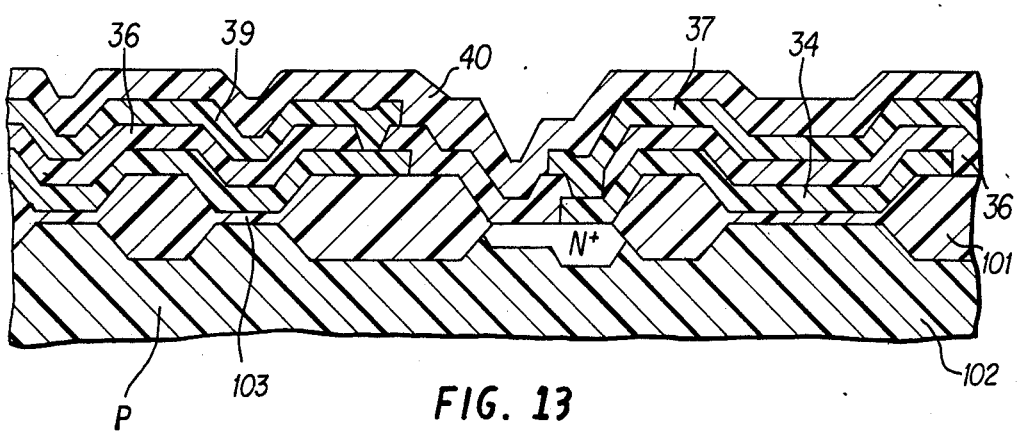

Nextly, a second embodiment of this invention is explained as follows. At first, a field insulation layer (101) is formed on a P type semiconductor substrate (102) having the resistivity of about 20 to 50 Ω.cm, as shown in FIG. 10. The field insulating layer is formed by oxidizing the substrate (102) selectively, and has a thickness of about 1 μm. Then the substrate (102) is heated at high temperature, and a gate insulation layer (103) having a thickness of about 400 to 1000 Å is formed. Hole (33) is formed by a photo engraving process. After this step, a first poly-Si layer (34) is deposited on the surface as shown in FIG. 11. The first poly-Si layer (34) is formed by chemical vapor deposition. Then phosphorus ion impurities are diffused into the layer (34) in order to decrease the resistivity of the layer (34). Nextly, the layer (34) is selectively etched by a photo engraving process to form the circuit element in the substrate (102). Arsenic ion impurities are diffused into the substrate (102) by using the field insulation layer (101) and the layer (34) as a mask, and a N+ region is formed in the substrate (102). The N+ region under the poly-Si layer (34) is formed deeper than that under the exposed area, because the phosphorous ion included in the poly-Si layer is diffused faster than the arsenic ion. The N+ region is used as drain and source regions of a MOS transistor or the other circuit element. Then an insulation layer (36) is formed covering the poly-Si layer (34) as shown in FIG. 12. The insulation layer (36) has a thickness of about 2000 to 4000 Å, and is formed by chemical vapor deposition or thermal oxidation. Next, contact hole (35) is formed by a photo engraving process, and a poly-Si layer (37) is deposited on the insulation layer (36) and in the contact hole (35). The poly-Si layer (37) is selectively etched and may operate as a resistor because doped impurities are restrained at low level. Then a plurality of contact holes (38) are formed on the field insulation layer by etching the insulation layer (36) selectively, and a MoSi$_2$ layer (39) is deposited on the insulation layer (36). The MoSi$_2$ layer (39) is formed by evaporating or sputtering. The MoSi$_2$ layer (39) is selectively etched and is formed in a predetermined pattern. In this process, it is desirable to etch all of the MoSi$_2$ layer on the second poly-Si layer (37). The MoSi$_2$ layer (39) is parallel connected to the first poly-Si layer (36) operating as a wiring layer. Nextly an insulating layer (40) covers on the surface as shown in FIG. 13. Then, an external electrode of aluminum will be deposited on the surface and be connected to the wiring layer or the circuit elements thereunder through the plurality of contact holes. In this step, the evaporation of the aluminum is treated in a high temperature. But, as MoSi$_2$ has a high melting point, the MoSi$_2$ doesn't melt.

In the above-mentioned process, as the MoSi$_2$ (39) is parallel connected to the first wiring layer (34), the first wiring layer (34) made of polycrystalline silicon will be considered as having much lower resistivity. So, the delay time of the first wiring layer (34) will be improved exceedingly. Further, the MoSi$_2$ adheres to the SiO$_2$ or poly-Si layer steadily, and the rate of expansion thereof is about equal to that of the poly-Si. So, the MoSi$_2$ is useful to the semiconductor device.

Figure 14:
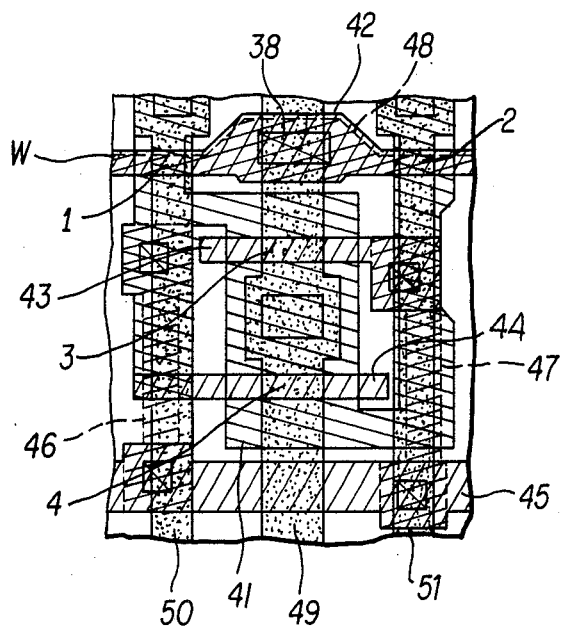
FIG. 14 is a plane pattern view of the semiconductor device of this invention.

FIG. 14 shows the plane pattern of the random access memory cell in FIG. 1 according to this invention. The region (41) is the N+ region and operates as the source and drain regions of the MOS transistors (1), (2), (3) and (4). Regions (42), (43), (44) and (45) are the first poly-Si layer (34) and respectively operate as the word line (7), the gate electrodes of the transistors (3) and (4) and the Vcc line. The regions (43) and (44) are respectively connected to the drain regions of the transistors (4) and (3) through the contact holes. Regions (46) and (47) are the second poly-Si layer (37) and respectively operate as resistors (5) and (6). Then, region (48) is the MoSi$_2$ layer (39) and is parallel connected to the word line (42) through the contact holes. Regions (49), (50) and (51) are the aluminum layer and respectively operate as the Vss line and the data lines (8) and (9).

In the memory cell of FIG. (14), the first poly-Si layers (42), (43), (44) and (45) are used as active elements like the electrodes of the transistor, the data line or other wiring layer. The second poly-Si layers (46) and (47) are used as a resistor. As the second poly-Si layers (46) and (47) is formed on the first poly-Si layer, the area occuping the elements is reduced and a densely packed integrated circuit is realized.

It is possible to use the second poly-Si layer as a wiring layer. The MoSi$_2$ layer (48) is used as a wiring layer and is parallel connected to the word line (42) made of the first poly-Si layer. It is possible to consider the MoSi$_2$ layer as a portion of an electrode, and it is desirable not to deposit the MoSi$_2$ layer over the second poly-Si layer and to be treated like the same layer. This prevents the difference of the level from increasing, so the aluminum layer thereon will be hard to cut off at the stepped portion. Further, the process is simplified. Then, if the resistors (5) and (6) made of poly-Si are formed over the flip-flop circuit, the MoSi$_2$ layer can be formed over the word line (7) and not over the second poly-Si layers (46) and (47), and be treated as the same layer as the second poly-Si layers (46) and (47). Further, the MoSi$_2$ layer can be replaced by another metal silicide layer having a high melting point, for example a tungsten silicide layer.

Figure 15:
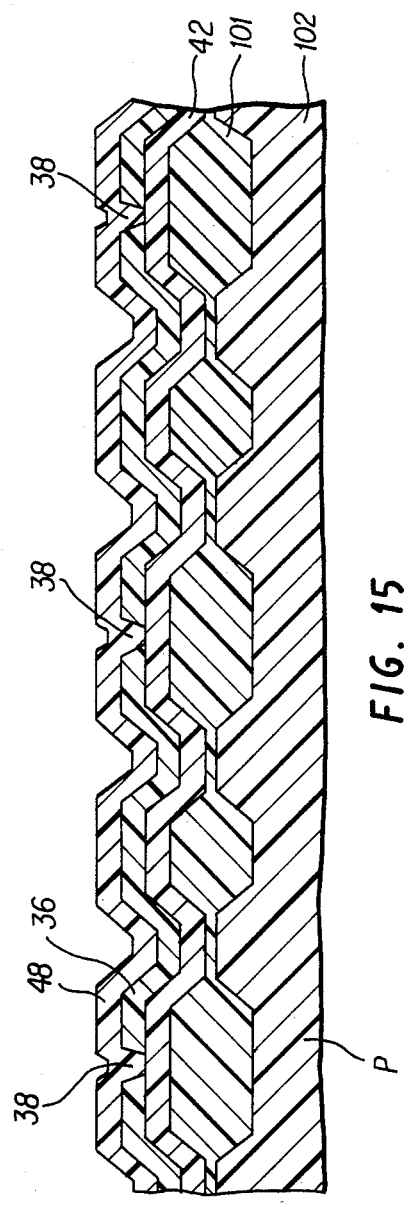
FIG. 15 is a cross-sectional view of the semiconductor device of this invention.
Figure 16:
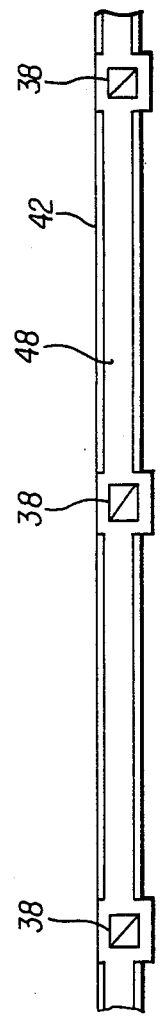
FIG. 16 is a plane pattern view of the device of this invention.

FIG. 15 shows a structure in which the MoSi$_2$ layer (48) and the word line (42) made of the first poly-Si layer (34) are parallel connected through a plurality of contact holes (38) on the field insulation layer (101). FIG. 16 shows a plane pattern of the device in FIG. 15. As the word line (42) is parallel connected to the MoSi$_2$ layer (48), the resistive value of the word line (42) is substantially determined by the resistivity of the MoSi$_2$ layer (48). Namely, the resistivity of MoSi$_2$ is about 2 to 4 $\Omega$/square and is about one tenth that of poly-Si. So the delay time of the word line can be reduced to about one tenth of the prior device, and a very high speed memory device can be realized. Further, as the MoSi$_2$ layer is the same layer level as the second poly-Si layer, the cut off of the aluminum thereon is restrained and the process is simplified. This embodiment is similarly applicable to the various circuits noted above with respect to the first embodiment, too.

Obviously, many modifications and variations of this invention are possible in the light of above teachings. It is therefore to be understood that within the scope of the appended claims, this invention may be practiced otherwise than as specifically described.

What is claimed as new and desired to be secured by Letters Patent in the United States is:

1. A semiconductor device comprising:
   a plurality of semiconductor elements having at least one PN junction and formed on a substrate;
   a first insulation layer formed on the substrate including a gate insulation layer and a field insulation layer, said field insulation layer having a greater thickness than said gate insulation layer;
   a first conductive layer formed on the first insulation layer; and
   a second insulation layer formed on the first conductive layer;
   a second conductive layer formed on the second insulation layer and formed narrower than the first conductive layer and made of metal silicide layer having high melting point, said second conductive layer parallel connected on the field insulating layer to the first conductive layer in order to reduce the resistivity of the first conductive layer.

2. A semiconductor device comprising a plurality of semiconductor elements having at least one PN junction and formed on a substrate, comprising:
   a first insulation layer formed on the substrate including a gate insulation layer and a field insulation layer, said field insulation layer having a greater thickness than said gate insulation layer;
   a first conductive layer formed on the first insulation layer;
   a second insulation layer formed on the first conductive layer; and
   a second conductive layer formed on the second insulation layer;
   wherein the second conductive layer includes one region having high conductivity and an other region having low conductivity, and the one region is parallel connected to the first conductive layer through a plurality of contact holes on the field insulation layer and is formed narrower than the first conductive layer, and the other region is used as a resistive means and wherein the one region is made of metal silicide having a high melting point and the other region is made of poly-Si.

3. A semiconductor device comprising:
   a semiconductor substrate having one conductivity type;
   a plurality of regions having another conductivity type formed in the substrate, wherein the regions operate as source and drain regions of MOS transistors;
   a first insulation layer formed on the substrate including a gate insulation layer and a field insulation layer, said field insulation layer having a greater thickness than said gate insulation layer;
   a first conductive layer formed on the first insulation layer;
   a second insulation layer formed on the first conductive layer and having substantially uniform thickness; and
   a second conductive layer formed on the first conductive layer and formed narrower than the first conductive layer, and including a high conductivity region and a low conductivity region;
   wherein the high conductivity region is used as a wiring layer and is parallel connected on the field insulation layer to the first conductive layer, and the low conductivity region is used as a resistor and connected to an electrode of a MOS transistor and wherein the high conductivity region is made of metal silicide having a high melting point and the lower conductive region is made of poly-Si.

4. A semiconductor device including a plurality of MOS transistors formed on a substrate, comprising:
   a first insulation layer formed on the substrate including gate insulation layers of the MOS transistors and a field insulation layer, said field insulation layer having a greater thickness than said gate insulation layer;
   a first conductive layer made of poly-Si formed on the first insulation layer and operating as gate electrodes of the MOS transistors;
   a second insulation layer formed on the first conductive layer; and
   a second conductive layer formed of poly-Si formed on the second insulation layer;
   wherein the second conductive layer includes one region having high conductivity and an other region having low conductivity, and the one region is parallel connected to the first conductive layer directly through at least three contact holes in the second insulation layer and is formed narrower than the first conductive layer, and the other region is used as a resistive means.

5. A semiconductor device according to claim 4, wherein the first and second conductive layers are made of poly-Si.

* * * * *